(12) United States Patent
Slater et al.

(10) Patent No.: US 6,193,334 B1
(45) Date of Patent: Feb. 27, 2001

(54) THERMAL CONTROL APPARATUS FOR TWO-AXIS MEASUREMENT SYSTEM

(75) Inventors: Dan Slater, La Habra Heights; Thomas Paige, Cypress, both of CA (US)

(73) Assignee: Nearfield Systems Incorporated, Carson, CA (US)

( * ) Notice: Subject to any disclaimer, the term of this patent is extended or adjusted under 35 U.S.C. 154(b) by 0 days.

(21) Appl. No.: 09/156,155

(22) Filed: Sep. 18, 1998

(51) Int. Cl.$^7$ .............................. H01Q 1/12; H01Q 3/08
(52) U.S. Cl. ........................................... 303/765; 343/765
(58) Field of Search ................................... 343/703, 761, 343/765; H01Q 1/12, 3/08

(56) References Cited

U.S. PATENT DOCUMENTS

| | | |
|---|---|---|
| 4,364,234 | 12/1982 | Reed . |
| 4,799,063 * | 1/1989 | Hill ...................................... 343/703 |
| 4,814,625 | 3/1989 | Yabu . |
| 4,984,891 | 1/1991 | Miyazaki et al. . |
| 5,106,191 | 4/1992 | Ohtsuka . |
| 5,141,318 | 8/1992 | Miyazaki et al. . |
| 5,146,284 | 9/1992 | Tabarelli et al. . |
| 5,155,551 | 10/1992 | Vidrine et al. . |
| 5,185,643 | 2/1993 | Vry et al. . |
| 5,300,939 * | 4/1994 | Maeda et al. .......................... 343/703 |
| 5,408,318 | 4/1995 | Slater . |
| 5,419,631 | 5/1995 | Slater . |
| 5,420,687 | 5/1995 | Kachanov . |
| 5,469,260 | 11/1995 | Takagi et al. . |
| 5,476,137 | 12/1995 | Ochiai et al. . |

OTHER PUBLICATIONS

"A Practical Solution To The Thermal Stability Problem In Machine Tools", By Bryan et al., Lawrence Livermore Laboratory, Engineering Conference, Chicago, Apr. 1972.

* cited by examiner

*Primary Examiner*—Michael C. Wimer
(74) *Attorney, Agent, or Firm*—O'Melveny & Myers LLP

(57) ABSTRACT

A two-axis measurement system for use with an article under test (AUT) is provided with a thermal control system to maintain the measurement system at a stable temperature. The thermal control system may be use a temperature-controlled fluid, such as liquid or gas, conducted through the measurement system. The measurement system further comprises a field probing sensor that is adapted to be positioned at a plurality of points spaced from the AUT to perform a measurement of the AUT. The probing sensor is manipulated by at least a first member extending in a first axial direction and a second member extending in a second axial direction perpendicular to the first axial direction. A near-field measurement of the AUT is performed by moving the field probing sensor in a pattern in front of the AUT to sample the RF energy of the AUT at a plurality of points. Internal passageways provided through the first and second members permit communication of the temperature-controlled fluid therethrough.

31 Claims, 7 Drawing Sheets

THERMAL CONTROL APPARATUS FOR TWO-AXIS MEASUREMENT SYSTEM

BACKGROUND OF THE INVENTION

1. Field of the Invention

The present invention relates to two-axis measurement systems, and more particularly, to a robotic scanner for performing planar near-field antenna measurements which includes a control system to maintain thermal stability of the scanner in an otherwise uncontrolled thermal environment.

2. Description of Related Art

High performance antennas are increasingly prevalent in the art as spacecraft, aircraft, ship and ground vehicle mission requirements become more sophisticated. One problem in the development and manufacture of high performance antennas is the measurement of antenna performance. Traditionally, antenna measurement was conducted by placing the antenna at a remote location to measure the amplitude response characteristics of the antenna in its operational range. Typical operational distances for high gain antennas can range from fifty feet to three miles. This measurement technique, known as far-field testing, suffers from significant limitations, such as susceptibility to weather effects, ground reflections and increasing real estate costs.

As an alternative to far-field testing, near-field testing was developed. A nearfield test is conducted in an indoor test range using a microwave probe to sample the field radiated near the antenna under test (AUT). A computer collects the amplitude and phase data sampled by the microwave probe, and calculates the far-field equivalent response using a Fourier transform technique. Accurate near-field measurements require that all the significant antenna energy be sampled by the microwave probe. Highly directive antennas, such as reflectors and waveguide phased arrays, beam most of the energy in the forward direction normal to the antenna aperture. To test these types of antennas, a planar near-field robotic scanner is utilized to move the microwave probe along a planar pattern approximately normal to the antenna aperture. To accurately reconstruct the measured field, the probe must sample the antenna energy at a plurality of points with a minimum spacing based on the Nyquist sampling theorem. A near-field measurement system of this nature is described in U.S. Pat. No. 5,408,318 to Slater, for WIDE RANGE STRAIGHTNESS MEASURING SYSTEM USING A POLARIZED MULTIPLEXED INTERFEROMETER AND CENTERED SHIFT MEASUREMENT OF BEAM POLARIZATION COMPONENTS, assigned to the same assignee as the present invention, the subject matter of which is incorporated herein by reference.

The near-field measurement technique is also applicable to other types of reflecting bodies, emitters/receptors or transducers having other types of emitted waveforms, such as optical or acoustic waves, and is effective in measuring performance of antennas, lenses, anechoic chambers and compact ranges. The measuring probe may act as both a transmitting antenna and a receiving antenna for measuring a reflected phase front from a reflecting body. The reflecting or transducing bodies discussed herein are collectively referred to as antennas or transducers.

To make accurate near-field measurements, all the significant antenna energy must be sampled by the probe. Highly directive antennas, such as reflectors and waveguide phased arrays, send most of the energy in the forward direction normal to the antenna aperture. To test these types of antennas, a planar near-field scanner is utilized. Precision positioning systems, such as Cartesian robots, are used to move the probe along a planar raster pattern approximately normal to the antenna aperture. Cylindrical and spherical scanners are also possible, in which the AUT is rotated relative to a measuring probe. To accurately reconstruct the measured field, the probe must sample points at some minimum spacing which is usually less than half the wavelength of the antenna signal ($\lambda/2$). Therefore, to achieve an accurate near-field measurement, the precise position of the probe and its planarity with respect to the AUT is critical.

Obtaining high accuracy position information for the probe relative to the test article has proven to be difficult to achieve. Undesired variations in the spacing between the probe and the AUT can be experienced due to thermally induced expansion and contraction of the scanner structure. Even in a controlled environment, such as an indoor testing facility, thermal variations may be experienced due to periodic cycling of the air conditioning system within the facility. The temperature fluctuations affect the near-field measurement by distorting the shape of the AUT mount and near-field scanner mount that adversely affects azimuth and elevation of the AUT with respect to the probe. These distortions in AUT position further result in distortion of the energy emitted by the AUT, and decrease the accuracy of the near-field measurement. A method of correcting for thermal drift between the AUT and the scanner is disclosed in U.S. Pat. No. 5,419,631, to Slater, for THREE-AXIS MOTION TRACKING INTERFEROMETER FOR MEASUREMENT AND CORRECTION OF POSITIONAL ERRORS BETWEEN AN ARTICLE UNDER TEST AND A MEASUREMENT PROBE, assigned to the same assignee as the present invention, the subject matter of which is incorporated herein by reference. As with the near-field scanner structure, the phase reference cable that carries the signal from the probe is highly susceptible to temperature changes, which can cause physical changes in the length of the phase reference cable by as much as several wavelengths. Such dimensional changes adversely affect the accuracy of the near-field measurement.

It is increasingly desirable to perform some antenna near-field testing at a field location of the antenna, without removing the antenna to an indoor test facility. For example, certain large antennas mounted on ships cannot be easily removed from service for periodic testing, and it would therefore be advantageous to perform near-field tests on these antennas while in their operational location. The outdoor position of these antennas presents a particularly harsh thermal environment, with unpredictable variations in temperature of the AUT and the scanner due to atmospheric effects, as well as thermal coupling of the scanner to local heat sources or sinks, uneven heat transfer rates, and material mismatches.

Thus, a critical need exists to increase the thermal stability of the scanner to permit operation in an uncontrolled environment. It would be particularly desirable to provide a thermally stable scanner without substantially increasing its operational weight or complexity.

SUMMARY OF THE INVENTION

In accordance with the teachings of the present invention, a two-axis measurement system for use with an article under test (AUT) is provided with a thermal control system to maintain the measurement system at a stable temperature. The thermal control system may use a fluid, such as gas or liquid, as a thermal conducting medium for heating or cooling the measurement system.

More particularly, the measurement system comprises a field probing sensor that is adapted to be positioned at a plurality of points spaced from the AUT to perform a measurement of the AUT. The probing sensor is manipulated in a pattern in front of the AUT to sample the RF energy of the AUT at a plurality of points. The probing sensor may be manipulated through a raster pattern by at least a first member extending in a first axial direction and a second member extending in a second axial direction perpendicular to the first axial direction. Similarly, cylindrical or spherical movement patterns may also be utilized. A near-field measurement of the AUT is generated from the RF energy sampled from the AUT.

In an embodiment of the invention, a circulating gas is used to thermally stabilize the measurement system. The first member further comprises a shroud defining a passageway extending lengthwise along the first member adapted to conduct the gas therethrough. A plenum is disposed at an end of the first member to increase pressure within the passageway. A support frame for the first and second members comprises a plurality of legs coupled to ends of the first member, with the legs each having respective internal passageways in communication together to conduct the gas therethrough. A flow restricter may be disposed in at least one of the legs to increase gas pressure within the internal passageways.

In another embodiment of the invention, a circulating liquid is used to thermally stabilize the measurement system. The first member further comprises a main pipe extending lengthwise therethrough to conduct the circulating liquid. According to a first construction of this embodiment, the first member further comprises a manifold plate coupled to the main pipe, with the manifold plate having a plurality of channels. A plurality of tubes extend along surfaces of the first member, and are coupled to respective ones of the channels. The liquid passes through the channels and the tubes. According to a second construction, the channels extend to surfaces of the first member, allowing the liquid to flow along the surfaces. According to a third construction, the main pipe further comprises spray nozzles adapted to provide a turbulent flow of liquid within the first member. According to a fourth construction, the main pipe further comprises a plurality of spaced openings adapted to provide a mist of liquid within the first member. In each of these four constructions, the liquid conducts heat out of or in to the first member as necessary to maintain the measurement system at a uniform temperature. The liquid may also be conducted through a jacket surrounding the phase reference cable to maintain it at a uniform temperature.

A more complete understanding of the thermal control apparatus for a two-axis measurement system will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the critical need for a scanner having increased thermal stability to permit operation in an uncontrolled environment. In the detailed description that follows, like element numerals are used to describe like elements illustrated in one or more of the figures.

Figure 1:
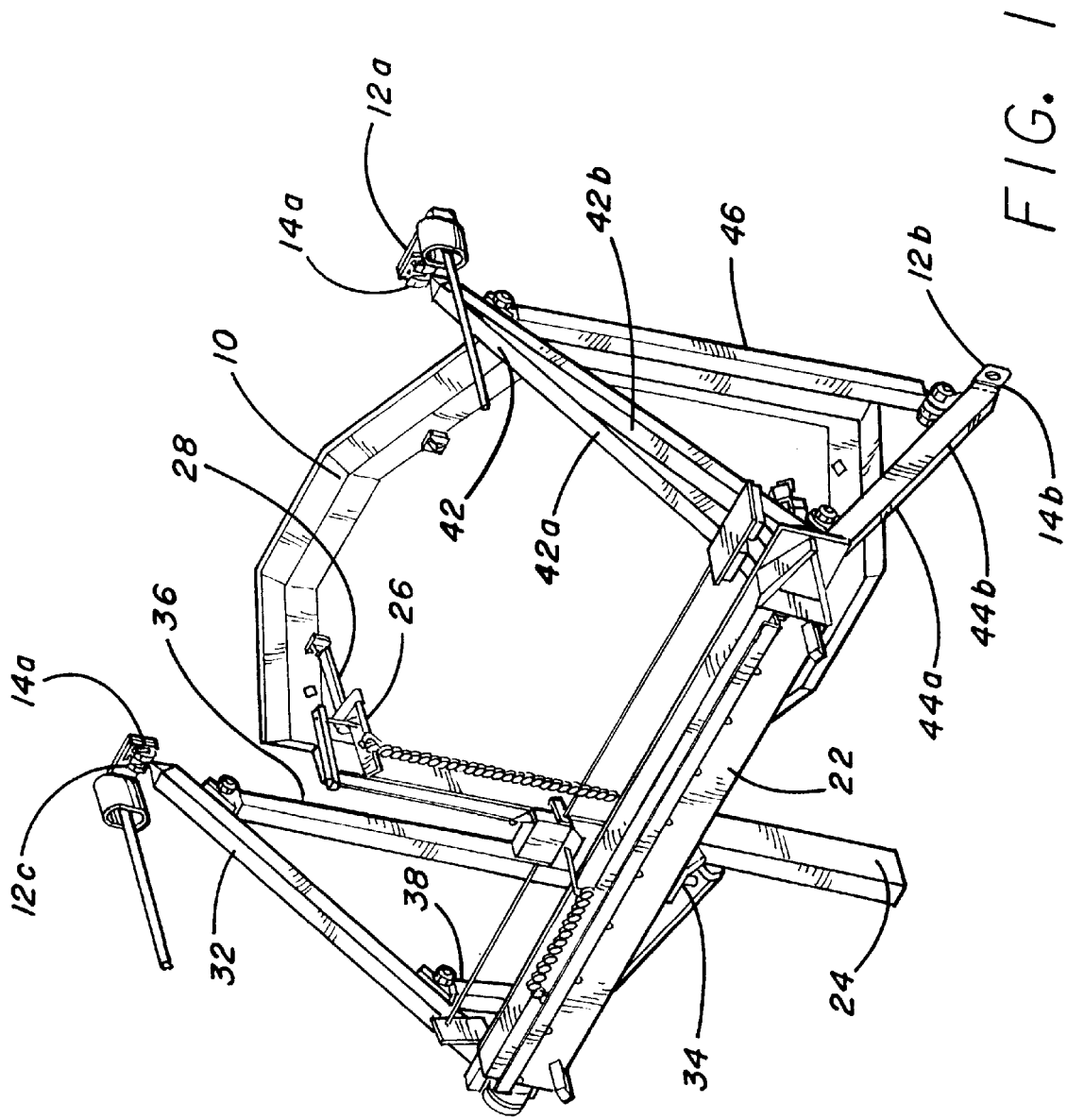
FIG. 1 is a perspective view of an antenna under test with a first embodiment of a thermally-stabilized near-field scanner having a circulating gas.

Referring first to FIG. 1, a first embodiment of a portable scanner is illustrated in conjunction with a planar phased-array antenna 10. The antenna 10 has a slanted aperture plane and is externally mounted to the surface of a superstructure, such as the deckhouse of a ship. The portable scanner mounts to the superstructure to match the angle of the antenna aperture plane in order to move a probing sensor through a planar pattern to sample RF energy from the antenna 10. The portable scanner further comprises an x-axis beam 22 and a y-axis beam 24. The y-axis beam 24 is capable of controlled horizontal movement on rails disposed along the length of the x-axis beam 22. A probe carriage 26 is provided on the y-axis beam 24, and is capable of controlled vertical movement on rails disposed along the length of the y-axis beam. A probing sensor 28 extends from the probe carriage 26 in a direction normal to the plane formed by the x-axis beam 22 and the y-axis beam 24. By operation of the y-axis beam 24 and the probe carriage 26, the probing sensor 28 can be manipulated to any point along the plane.

As known in the art, the probing sensor 28 is moved in a repeatable pattern within the plane to sample the RF energy emitted from the antenna 10 at a plurality of points. A controller (not shown) may be used to control the position of the y-axis beam 24 and the probe carriage 26 by use of motors, belts, gears or other known mechanical systems. The probing sensor 28 transmits a signal representative of the sampled RF energy from the antenna 10, from which is computed the far-field equivalent phase and amplitude response of the antenna. It should also be appreciated that the scanner could also be adapted for movement in a cylindrical or spherical configuration to accommodate other antenna sizes and shapes.

The portable scanner further includes a mounting frame that supports the x and y-axis beams 22, 24 in the proper orientation relative to the antenna 10. The superstructure supporting the antenna 10 further includes a plurality of kinematic mounting brackets 12a–12c disposed at points spaced from the periphery of the antenna 10. The mounting brackets 12a–12c further include hooks 14a in the upper position and 14b in the lower position adapted to engage corresponding knobs of the scanner mounting frame. The mounting frame comprises an A-frame construction at each end of the x-axis beam 22 such that the mounting frame is coupled to the superstructure at four points. As will be further described below, the mounting frame illustrated in FIG. 1 is slightly different at each of the ends of the x-axis beam 22. Generally, the mounting frame and the x-axis beam 22 are interconnected in a linked manner to permit a continuous flow of fluid through the structure. The fluid is provided by a conventional heat pump or air conditioning system (not shown) that is controlled to maintain a desired gas temperature and pressure within the mounting frame and the x-axis beam 22.

More particularly, at the left side of the x-axis beam 22 (as seen in FIG. 1), the mounting frame includes a first leg 32 and a second leg 34 which each extend from the x-axis beam to the upper bracket 12c and a lower bracket (not shown). The first and second legs 32, 34 each have an upper knob (not shown) that engages the upper hook 14a of the upper bracket 12c and a lower knob that engages the lower hook of the corresponding bracket (not shown). A first cross member 36 extends between the first and second legs 32, 34 at a position proximate to the superstructure, and a second cross member 38 extends between the first and second legs 32, 34 at a position proximate to the x-axis beam 22. At the right side of the x-axis beam 22, the mounting frame includes a first leg 42 that divides into two portions 42a, 42b, and a second leg 44 that divides into two portions 44a, 44b. The first and second legs 42, 44 each extend from the x-axis beam 22 to the upper and lower brackets 12a, 12b. The first and second legs 42, 44 each have a knob (not shown) that engages the corresponding hooks 14a, 14b of the brackets 12a, 12b, respectively. A cross member 46 extends between the first and second legs 32, 34 at a position proximate to the superstructure.

Figure 2:
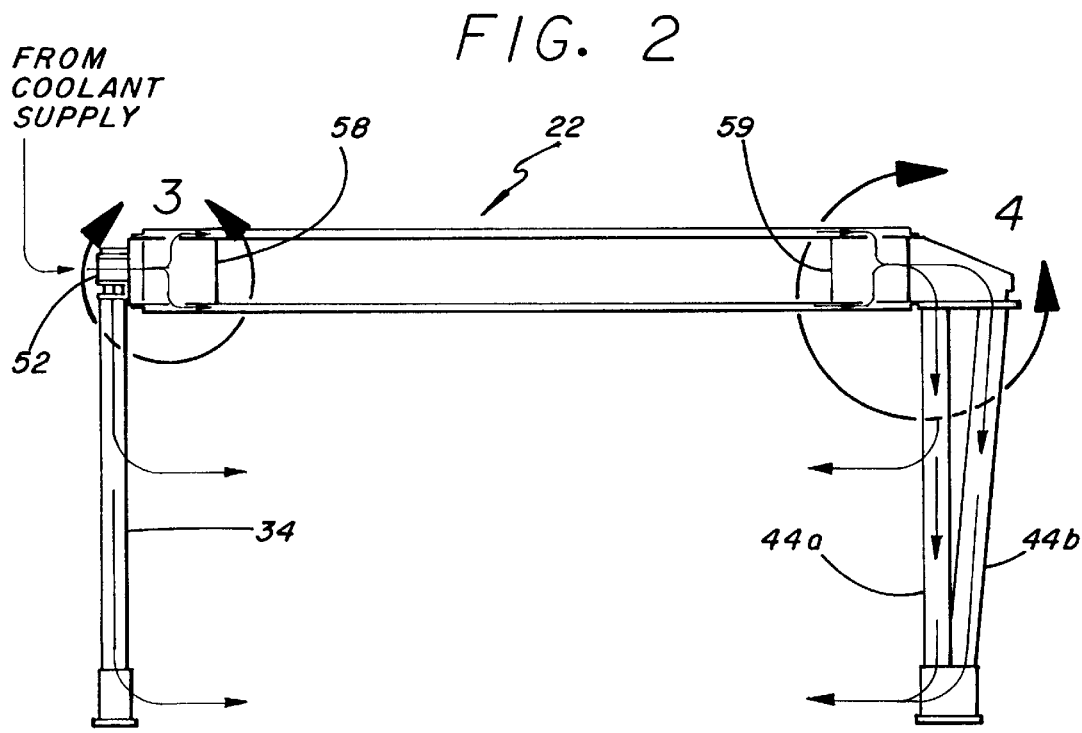
FIG. 2 is a side sectional view of the scanner of FIG. 1 illustrating the gas flow through the scanner.
Figure 3:
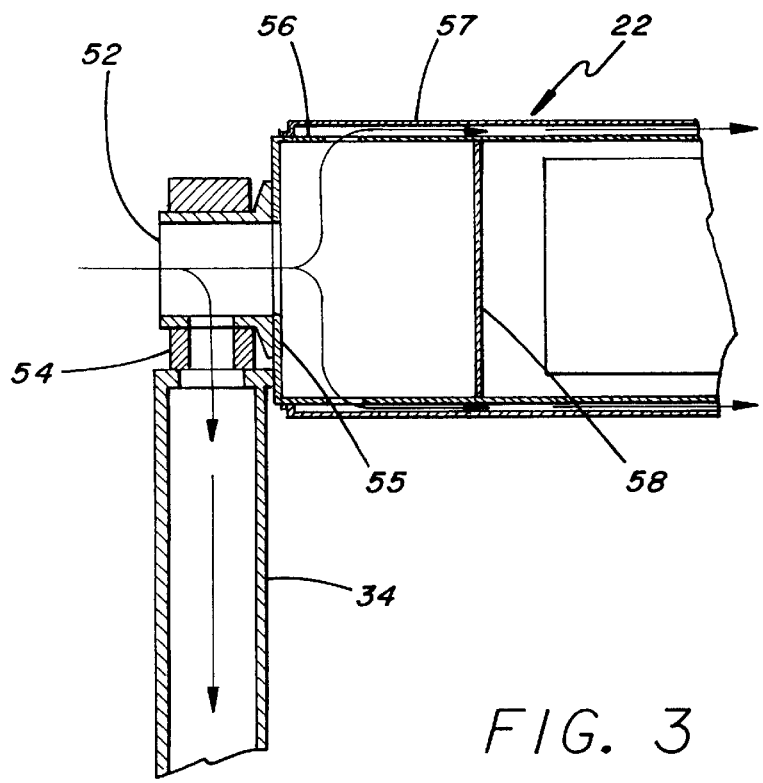
FIG. 3 is an enlarged portion of FIG. 2.

Referring now to FIGS. 2–7, the flow of a gaseous fluid through the mounting frame is illustrated by arrows. In particular, FIGS. 2 and 3 show the flow of gas into the x-axis beam 22. A gas inlet 52 is disposed at an end of the x-axis beam 22, and is adapted for coupling to a gas supply line from an external gas handling system. The x-axis beam 22 is provided within a housing 56 that encloses the operative elements of the x-axis beam, with the housing further enclosed by a shroud 57. A gap is defined between the shroud 57 and the housing 56 that defines a passageway for gas that extends entirely around the housing (shown in greater detail in FIG. 7). A barrier 58 extends across the interior of the housing 56. The gas inlet 52 is in communication with a plenum defined in the space within the end portion of the housing 56 bounded by the barrier 58. Openings are provided through the housing 56 within the plenum, so that gas that is provided through the gas inlet 52 pass through the plenum and into the gap between the shroud 57 and housing 56. The plenum provides a high pressure region which produces increased velocity within the shroud 57. The gas inlet 52 is also coupled through a pillow block 54 into the leg 34, which is hollow to permit the passage of gas therethrough.

Figure 4:
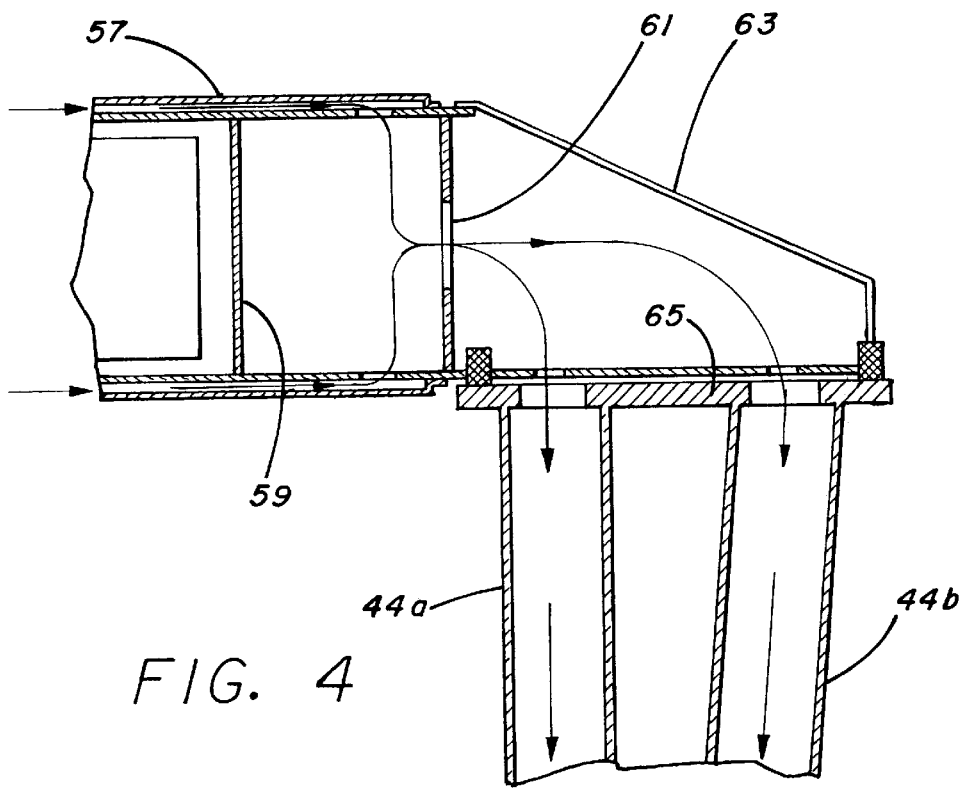
FIG. 4 is an enlarged portion of FIG. 2.

FIGS. 2 and 4 show the flow of gas out of the x-axis beam 22. As in the other end of the x-axis beam 22, a barrier 59 extends across the interior of the housing 56. The x-axis beam 22 is terminated by an outlet 61 comprising a plate having an aperture. Gas passing within the shroud 57 is exhausted into the space within the end portion of the housing 56 bounded by the barrier 59 and the gas outlet 61. The gas exits through the aperture in the outlet 61 into a plenum enclosed by cover 63. A manifold 65 provides a boundary for the plenum and allows communication between the plenum and legs 44a, 44b. As before, the plenum provides a high pressure region which produces increased velocity into the legs 44a, 44b.

Figure 5:
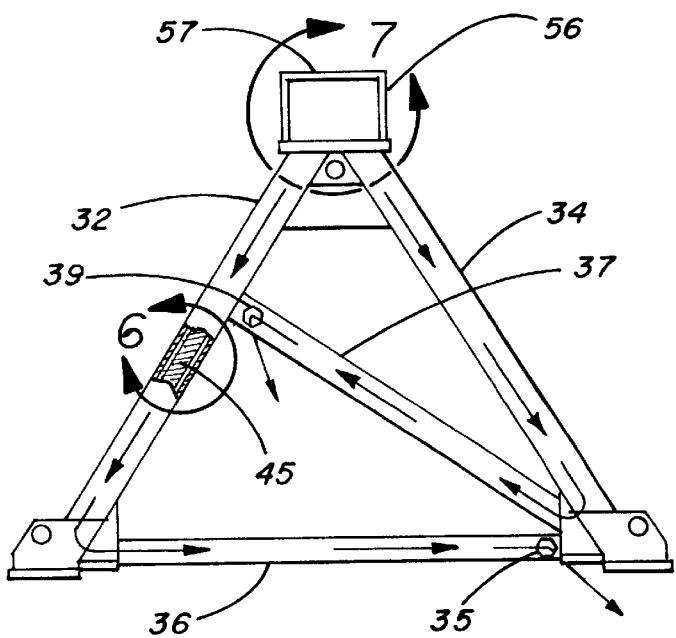
FIG. 5 is an end sectional view of the scanner of FIG. 1 illustrating the gas flow through the scanner.
Figure 6:
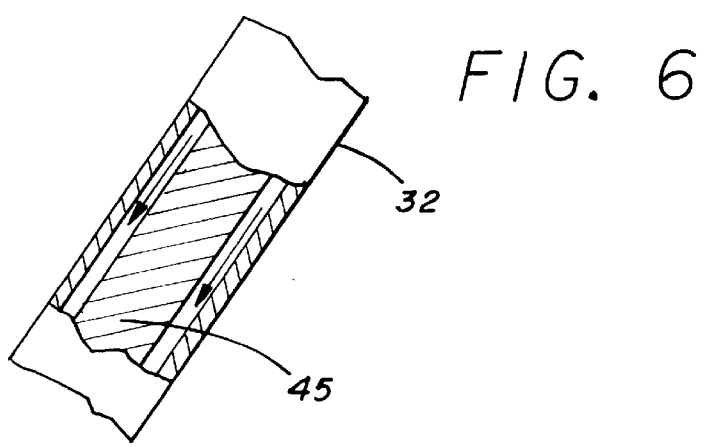
FIG. 6 is an enlarged portion of FIG. 5.
Figure 7:
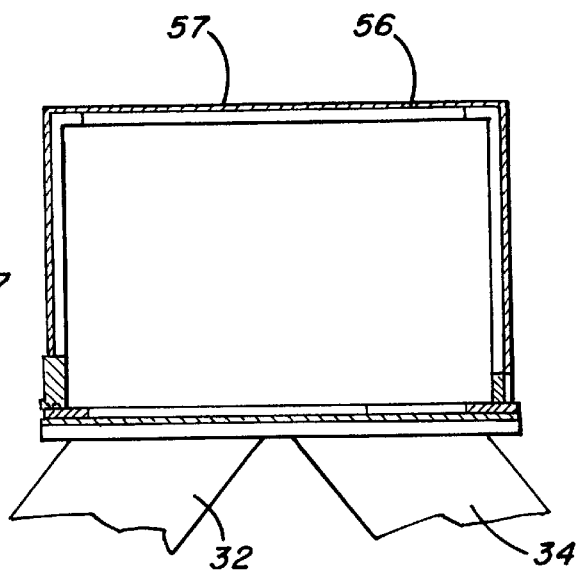
FIG. 7 is an enlarged portion of FIG. 5.

FIG. 5 illustrates the flow of the gas through the legs 32, 34 and cross-members 36, 37. Gas flows into leg 34 (as also shown in FIGS. 2 and 3) to an end thereof and couples into cross-member 37. After passing through cross-member 37, the gas exits through exhaust port 39. Similarly, the gas flows into leg 32 to an end thereof and couples into cross-member 36. After passing through cross-member 36, the gas exits through exhaust port 35. Gas pressure and velocity is maintained within the legs 32, 34 by use of a flow restricter 45, as shown in greater detail in FIG. 6 The restricter 45 blocks the majority of the internal volume of the leg 32 allowing passages around the restricter.

As will be appreciated by those skilled in the art, it is advantageous to maintain a high gas velocity through the mounting frame since this yields a greater transfer coefficient of heat from the mounting frame to the gas. The selective use of plenums and flow restricters to maintain pressure within the mounting frame serves to keep the gas velocity generally high. It should also be appreciated that the y-axis beam 24 may be constructed using thermally stable materials, or may also include a shroud in the same manner as the x-axis beam 22 to permit the flow of gas therethrough. It is anticipated that a gas flow system as described above would serve to control the scanner at a constant operational temperature even though the environment external to the scanner is uncontrolled. Further beneficial results may be achieved by enclosing the scanner within an insulated box.

Figure 8:
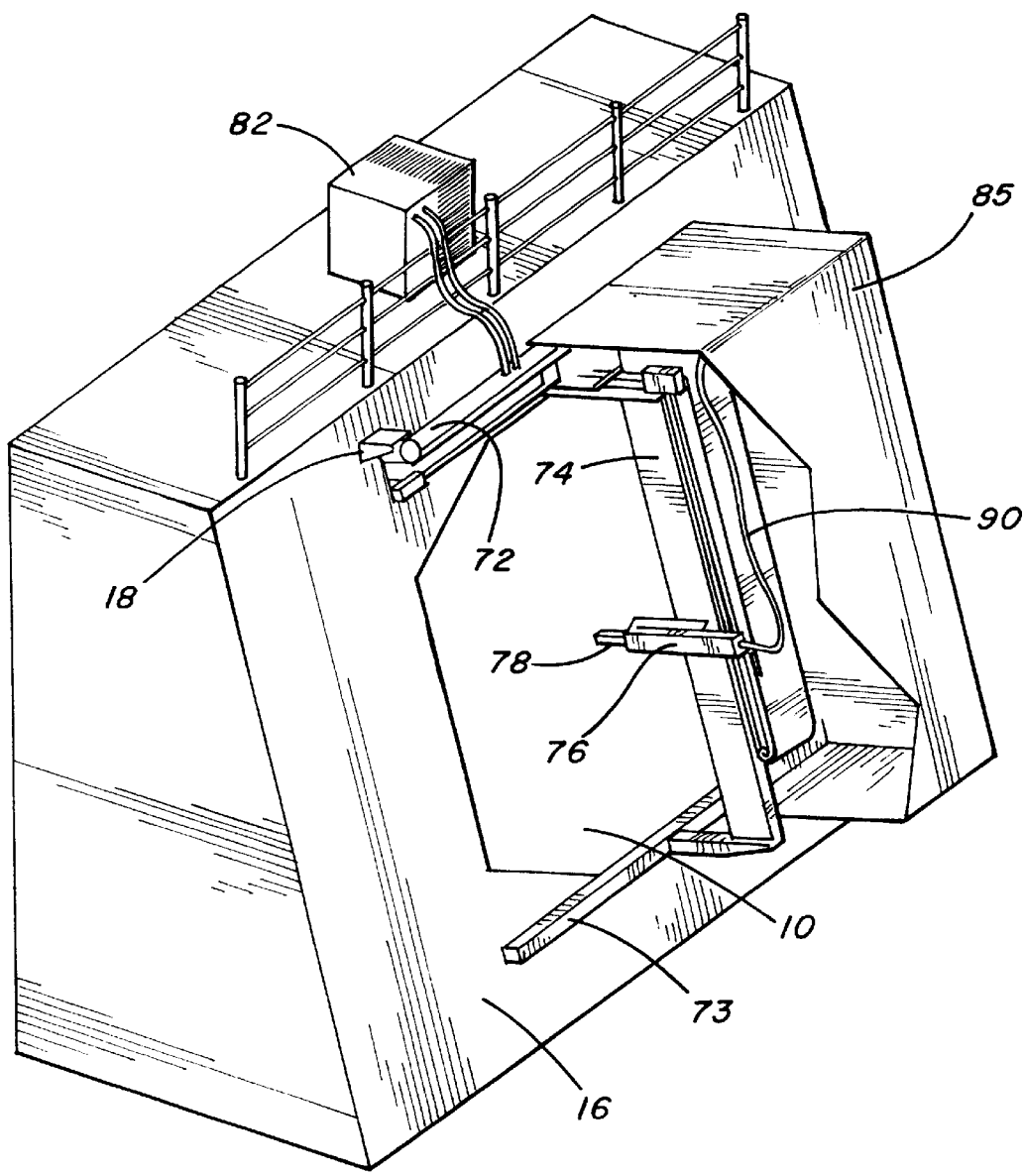
FIG. 8 is a perspective view of an antenna under test with a second embodiment of a thermally-stabilized near-field scanner having a circulating liquid.

Referring now to FIG. 8, a second embodiment of a portable scanner is illustrated in conjunction with a planar phased-array antenna 10. As in the first embodiment, the antenna 10 has a slanted aperture plane and is externally mounted to a superstructure 16. The portable scanner mounts to the superstructure 16 to match the angle of the antenna aperture plane in order to move a probing sensor through a planar pattern to sample RF energy from the antenna 10. The portable scanner further comprises an upper x-axis beam 72, a lower x-axis beam 73, and a y-axis beam 74. The upper and lower x-axis beams 72, 73 are disposed in parallel above and below the antenna 10, respectively. The y-axis beam 74 is capable of controlled horizontal movement on rails disposed along the length of the upper and lower x-axis beams 72, 73. A probe carriage 76 is provided on the y-axis beam 74, and is capable of controlled vertical movement on rails disposed along the length of the y-axis beam. A probing sensor 78 extends from the probe carriage 76 in a direction normal to the plane formed by the x-axis beams 72, 73 and the y-axis beam 74. By operation of the y-axis beam 74 and the probe carriage 76, the probing sensor 78 can be manipulated to any point along the plane. A phase reference cable 90 carries the sampled antenna energy signal from the probing sensor 78 to a near-field data processor 95 (see FIG. 14 described below).

Unlike the scanner of the first embodiment, the scanner illustrated in FIG. 8 does not include a mounting frame to support the x and y-axis beams 72, 73, 74. Instead, the upper and lower x-axis beams 72, 73 are coupled directly to the superstructure 16. Otherwise, the scanner of FIG. 8 operates substantially the same as the scanner of FIG. 1 in sampling RF energy from the antenna 10 to determine a far-field equivalent response. Also unlike the first embodiment, FIG.

9 illustrates a scanner that utilizes a temperature-controlled liquid source. A heat pump 82 mounted to the superstructure 16 provides a source of a temperature-controlled liquid, such as water or alcohol, to the scanner. An insulated box 85 encloses the scanner and antenna 10 to the superstructure to further maintain the scanner at a desired temperature. Referring now to FIGS. 9–12, the flow of liquid through the y-axis beam 74 is illustrated. It should be appreciated that the same structure would also be included in each of the upper and lower x-axis beams 72, 73 to control the temperature of these elements.

Figure 9:
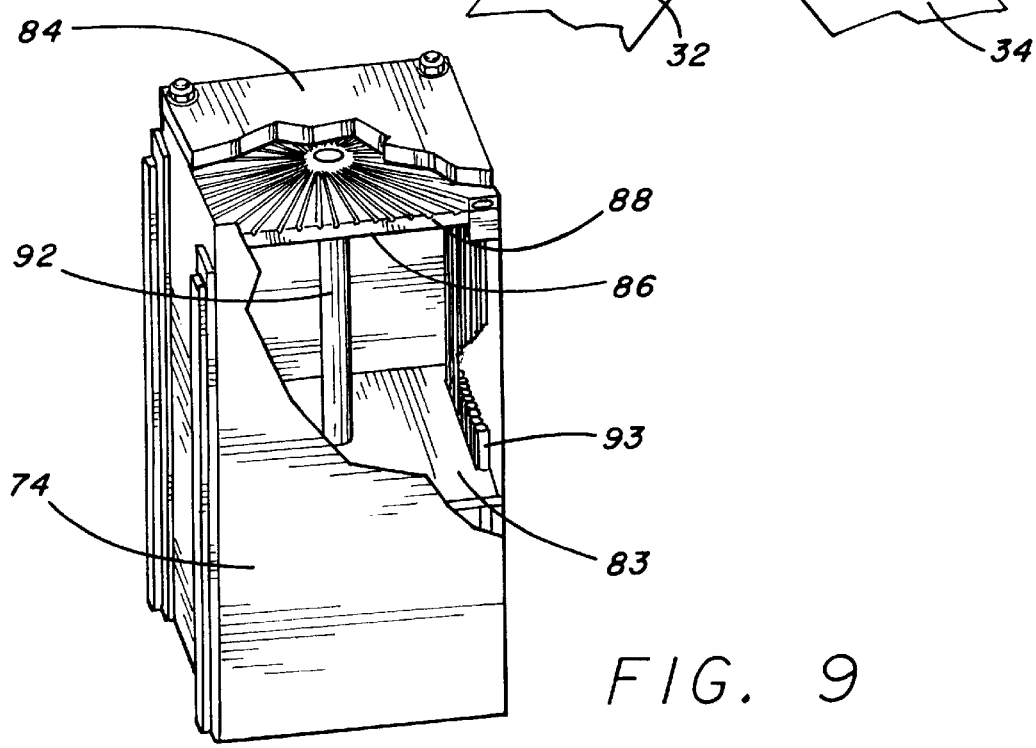
FIG. 9 is a partial perspective view of the scanner of FIG. 8 illustrating the fluid flow through the scanner.

FIG. 9 illustrates a first construction of the y-axis beam 74 including a thermally-stabilized control system of the present invention using a circulating liquid. An end of the y-axis beam 74 is formed with a sandwich of an end plate 84 and a manifold plate 86. The manifold plate 86 has a plurality of radially directed channels 88 that extend outwardly to edges of the plate from a hole in the center. A main pipe 92 extends lengthwise through the y-axis beam 74 and terminates at the hole in the center of the manifold plate 86. One or more baffles 83 extend across the interior of the y-axis beam 74 to provide structural support for the main tube 92. A plurality of thermal control 93 extend along the internal surface of the outer walls of the y-axis beam 74. The thermal control tubes 93 coincide with the ends of the channels 88 provided in the manifold plate 86. In operation, a temperature-controlled liquid is directed into the main pipe 92 from an inlet (not shown), which passes to the manifold plate 86. At the manifold plate 86, the liquid flows into the channels 88 and passes into corresponding ones of the thermal control tubes 93. The flow of liquid through the tubes 93 maintains the y-axis beam 74 at a desired temperature by conducting heat to or away from the outer surface of the beam.

Figure 10:
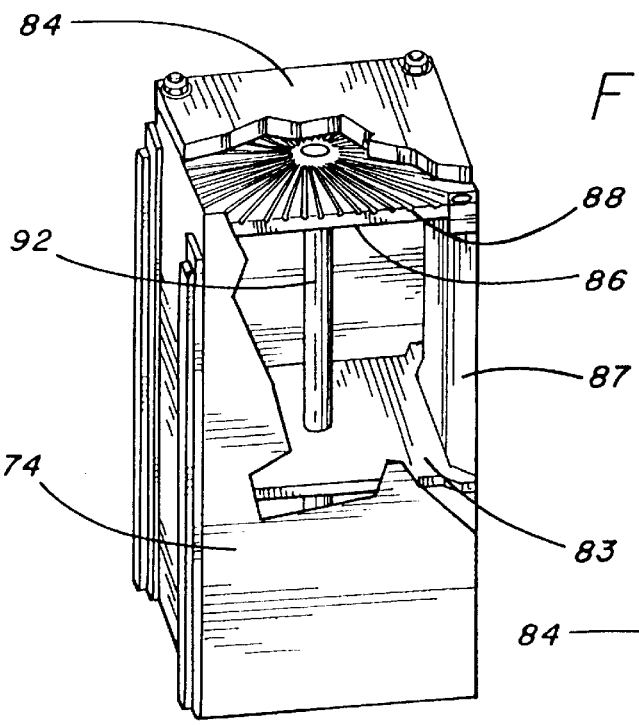
FIG. 10 is a partial perspective view of an alternative construction of the scanner of FIG. 8 illustrating the fluid flow through the scanner.

FIG. 10 illustrates a second construction of the y-axis beam 74 including a thermally-stabilized control system having a circulating liquid. As in the first construction, the y-axis beam 74 includes a manifold plate 86 with radial channels 88 coupled to a centrally disposed main pipe 92. Unlike the first construction, the y-axis beam 74 lacks the plurality of tubes 93. Instead, the liquid passes through the main pipe 92 and the channels 88 to the internal surface of the outer walls of the y-axis beam 74. The baffles 83 includes drains 87 disposed along the edges adjacent to the internal surfaces of the outer walls of the y-axis beam 74. The liquid then flows along the internal surface of the y-axis beam 74 and through the drains 87, until reaching a sump (not shown), at which point the liquid is collected for re-circulation. The flow of liquid maintains the y-axis beam 74 at a desired temperature by conducting heat to or away from the outer surface of the beam and into the fluid. It should be appreciated that this particular construction may be most effective in the y-axis beam 74 which is a vertically disposed member since the liquid will flow more evenly due to gravity. Nevertheless, it would be within the ordinary skill in the art to adapt the same construction to the horizontally disposed members of the scanner, i.e., the upper and lower x-axis beams 72, 73.

Figure 11:
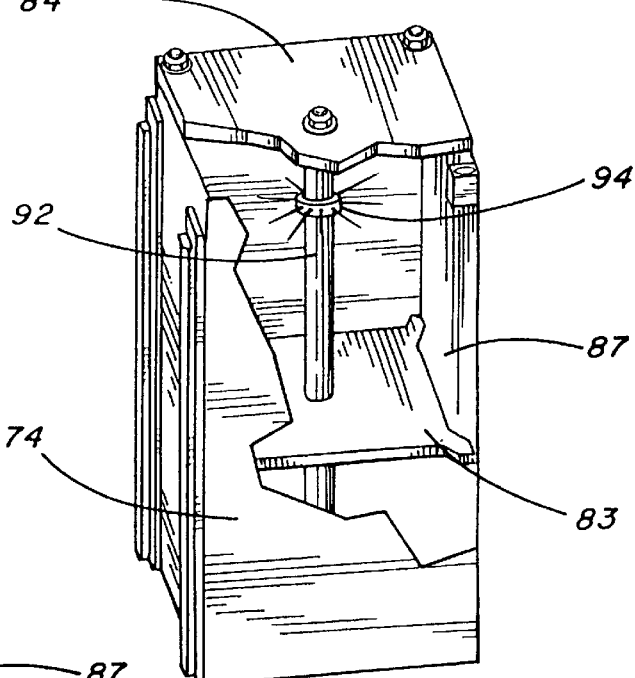
FIG. 11 is a partial perspective view of another alternative construction of the scanner of FIG. 8 illustrating the fluid flow through the scanner.

FIG. 11 illustrates a third construction of the y-axis beam 74 including a thermally-stabilized control system having a circulating liquid. The third construction lacks the manifold plate 86 of the first two constructions. Instead, the main pipe 92 is provided with a collar 94 having a plurality of spray nozzles. The liquid directed into the main pipe 92 is sprayed outwardly from the nozzles onto the internal surfaces of the outer walls of the y-axis beam 74. The liquid then flows along the internal surface of the y-axis beam 74 and through the drains 87 to a sump, at which point the liquid is collected for re-circulation. The flow of liquid maintains the y-axis beam 74 at a desired temperature by conducting heat to or away from the outer surface of the beam. The spray nozzles provide a turbulent flow of liquid within the y-axis beam 74, which increases the heat transfer coefficient of the liquid.

Figure 12:
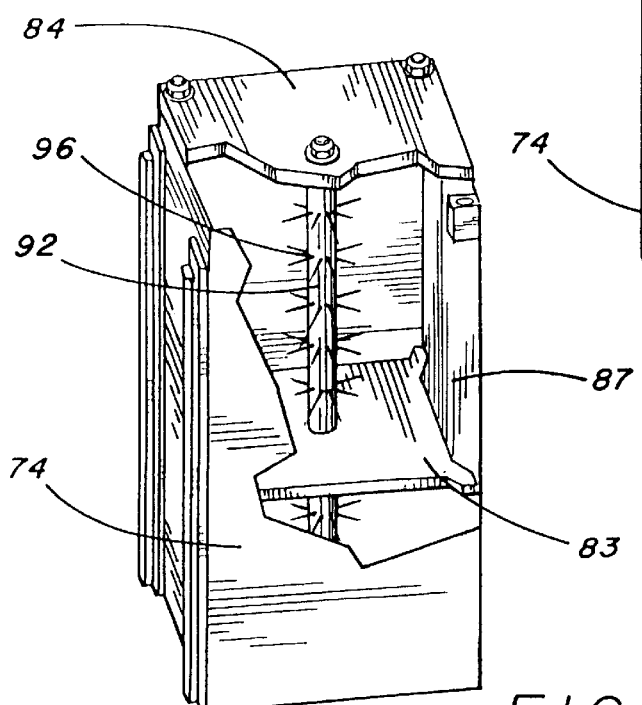
FIG. 12 is a partial perspective view of another alternative construction of the scanner of FIG. 8 illustrating the fluid flow through the scanner.

FIG. 12 illustrates a fourth construction of the y-axis beam 74 including a thermally-stabilized control system having a circulating liquid. The main pipe 92 is provided with a plurality of openings 96 that extend around the circumference of the pipe in spaced bands. As in the third construction, the liquid directed into the main pipe 92 is sprayed outwardly from the openings onto the internal surfaces of the outer walls of the y-axis beam 74. The openings 96 are generally smaller than the spray nozzles of the third construction, producing a spray mist within the y-axis beam 74 rather than a turbulent flow. The liquid then flows along the internal surface of the y-axis beam 74 and through the drains 87 to a sump, at which point the liquid is collected for re-circulation. The flow of liquid maintains the y-axis beam 74 at a desired temperature by conducting heat to or away from the outer surface of the beam.

Figure 13:
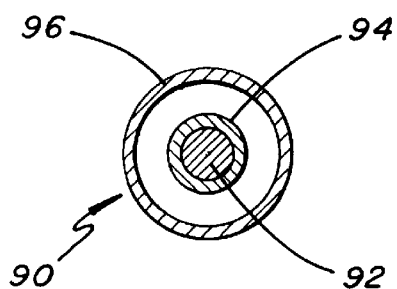
FIG. 13 is an end sectional view of a phase reference cable enclosed by a temperature-controlled fluid.
Figure 14:
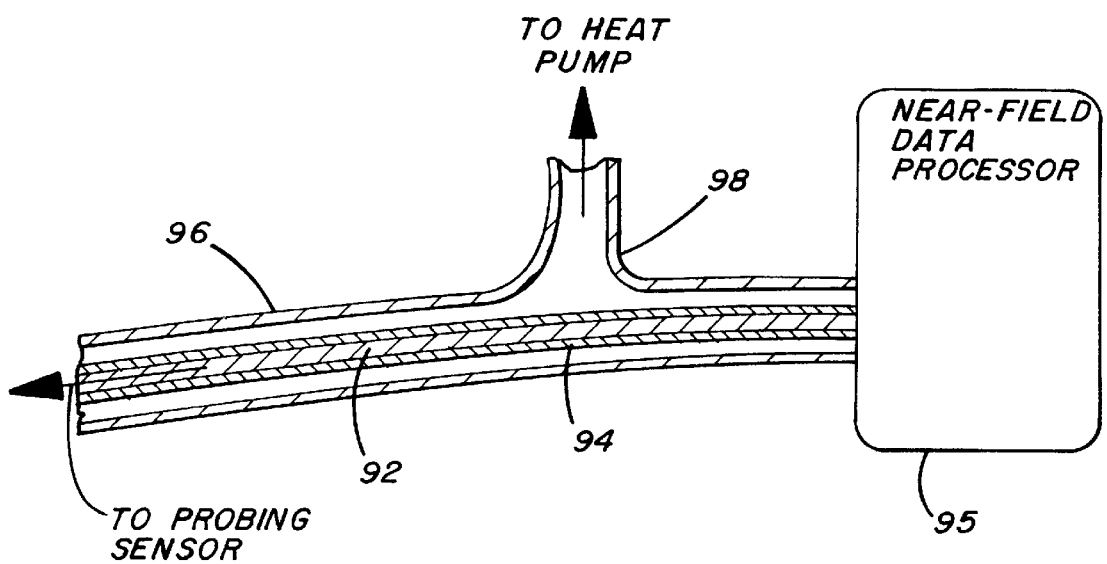
FIG. 14 is a partial side sectional view of the phase reference cable connected to a near-field data processor.

Referring now to FIGS. 13 and 14, the phase reference cable 90 is illustrated in greater detail. The phase reference cable 90 further comprises a central cable core 92 that carries the signal from the probing sensor 78 to the near-field data processor 95. The cable core 92 is further enclosed by an inner and an outer jacket 94, 96 each having substantially circular cross-sections. The inner jacket 94 has an inside diameter substantially the same as the outside diameter of the cable core 92 so that the cable core is enclosed snugly within the inner jacket. The outer jacket 96 has an inside diameter substantially larger than the outside diameter of the inner jacket 94 so that a space is defined therebetween. The space permits a temperature-controlled fluid to be conducted therethrough to maintain the cable core 92 at a controlled temperature. The outer jacket 96 further includes an outlet port 98 to provide a return path for the temperature-controlled fluid to the heat pump. The outer jacket 96 may further include an inlet port having similar construction as the outlet port 98, or alternatively, the temperature-controlled fluid may be communicated from the internal passages provided through the y-axis beam 74 described above. The inner and outer jackets 94, 96 are comprised of flexible, thermally conductive, non-permeable materials, such as plastic or rubber. The inner jacket 94 precludes the temperature-controlled fluid from contacting the cable core 92, which could result in corrosion of the cable.

Having thus described a preferred embodiment of a thermal control apparatus for a two-axis measurement system, it should be apparent to those skilled in the art that certain advantages of the within described system have been achieved. It should also be appreciated that various modifications, adaptations, and alternative embodiments thereof may be made within the scope and spirit of the present invention. For example, the mounting frame of the first embodiment described above could be configured for use with the second embodiment. Also, circulating fluid systems using both liquid and gas elements could be used together in a single scanner as part of an overall thermal control system. The invention is further defined by the following claims.

What is claimed is:

1. A two-axis measurement system for use with an article under test (AUT) comprising:

a field probing sensor;

means for positioning said field probing sensor at a plurality of points spaced from said AUT to perform a measurement of said AUT, said positioning means further comprising first and second structural members carrying said field probing sensor and being moveable relative to each other to move said field probing sensor; and means for maintaining thermal stability of at least one of said first and second structural members by conducting a temperature-controlled fluid therethrough in order to preclude dimensional changes of said positioning means.

2. The measurement system of claim 1, wherein said temperature-controlled fluid further comprises a gas.

3. The measurement system of claim 1, wherein said temperature-controlled fluid further comprises a liquid.

4. The measurement system of claim 1, wherein said first structural member extends in a first axial direction and said second structural member extends in a second axial direction perpendicular to said first axial direction.

5. The measurement system of claim 1, wherein said first member further comprises a shroud defining a passageway extending lengthwise along an axis of said first member adapted to conduct said fluid therethrough.

6. The measurement system of claim 5, further comprising a plenum disposed at an end of said first member to increase pressure within said passageway.

7. The measurement system of claim 1, wherein said positioning means further comprises a plurality of legs coupled to ends of said first member, said legs each having respective internal passageways in communication together to conduct said fluid therethrough.

8. The measurement system of claim 7, further comprising a flow restricter disposed in at least one of said legs to increase pressure within said internal passageways.

9. The measurement system of claim 7, wherein said plurality of legs are coupled in an A-frame configuration.

10. The measurement system of claim 1, wherein said first member further comprises a main pipe extending lengthwise therethrough, said main pipe conducting said fluid.

11. The measurement system of claim 10, wherein said first member further comprises a manifold plate coupled to said main pipe, said manifold plate have a plurality of channels.

12. The measurement system of claim 11, further comprising a plurality of tubes extending along surfaces of said first member, said plurality of channels being in communication with respective ones of said tubes, wherein said fluid passes through said channels and said tubes.

13. The measurement system of claim 11, wherein said channels extend to surfaces of said first member, wherein said fluid flows substantially along said surfaces.

14. The measurement system of claim 10, wherein said main pipe further comprises spray nozzles adapted to provide a turbulent flow of said fluid within said first member.

15. The measurement system of claim 9, wherein said main pipe further comprises a plurality of spaced openings along a length thereof adapted to provide a mist of said fluids within said first member.

16. The measurement system of claim 1, further comprising a reference cable coupled to said field probing sensor, and means for maintaining said reference cable at a desired temperature by conducting said temperature-controlled fluid in substantial contact therewith.

17. A two-axis measurement system for use with an article under test (AUT) comprising:

a field probing sensor;

a structural support frame including at least a first member extending in a first axial direction and a second member extending in a second axial direction perpendicular to said first axial direction, said second member carrying said field probing sensor, said second member being moveable relative to said first member, and said field probing sensor being moveable relative to said second member to enable positioning of said field probing sensor at a plurality of points spaced from said AUT to perform a measurement of said AUT; and a temperature-controlled fluid conducted through interconnected members of said structural support frame to maintain thermal stability and preclude dimensional changes of said structural support frame.

18. The measurement system of claim 17, wherein said first member further comprises a shroud defining a first passageway extending lengthwise along said first member adapted to conduct said fluid therethrough.

19. The measurement system of claim 18, further comprising a plenum disposed at an end of said first member to increase pressure within said passageway.

20. The measurement system of claim 17, wherein said support frame further comprises a plurality of legs coupled to ends of said first member, said legs each having respective internal passageways in communication together to conduct said fluid therethrough.

21. The measurement system of claim 20, further comprising a flow restricter disposed in at least one of said legs to increase pressure within said internal passageways.

22. The measurement system of claim 20, wherein said plurality of legs are coupled in an A-frame configuration.

23. The measurement system of claim 17, wherein said first member further comprises a main pipe extending lengthwise therethrough, said main pipe conducting said fluid.

24. The measurement system of claim 23, wherein said first member further comprises a manifold plate coupled to said main pipe, said manifold plate have a plurality of channels.

25. The measurement system of claim 24, further comprising a plurality of tubes extending along surfaces of said first member, said plurality of channels being coupled to respective ones of said tubes, wherein said fluid passes through said channels and said tubes.

26. The measurement system of claim 24, wherein said channels extend to surfaces of said first member, wherein said fluid flows substantially along said surfaces.

27. The measurement system of claim 23, wherein said main pipe further comprises spray nozzles adapted to provide a turbulent flow of said fluid within said first member.

28. The measurement system of claim 23, wherein said main pipe further comprises a plurality of spaced openings along a length thereof adapted to provide a mist of said fluid within said first member.

29. The measurement system of claim 17, wherein said temperature-controlled fluid further comprises a gas.

30. The measurement system of claim 17, wherein said temperature-controlled fluid further comprises a liquid.

31. The measurement system of claim 17, further comprising a reference cable coupled to said field probing sensor, said reference cable having a central core and an outer jacket with a space defined therebetween, temperature-controlled fluid being conducted through said space.

* * * * *